(12) United States Patent
Rinder et al.

(10) Patent No.: US 8,714,988 B1
(45) Date of Patent: May 6, 2014

(54) CONNECTOR FOR SELECTIVELY COUPLING AN ELECTRICAL LOAD TO A DEVICE UNDER TEST

(71) Applicant: Tektronix, Inc., Beaverton, OR (US)

(72) Inventors: Karl A. Rinder, Portland, OR (US); Neil C. Clayton, Hillsboro, OR (US); Richard A. Booman, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 13/662,317

(22) Filed: Oct. 26, 2012

(51) Int. Cl.
*H01R 12/00* (2006.01)

(52) U.S. Cl.
USPC .............................................. 439/65; 439/482

(58) Field of Classification Search
USPC ............ 439/65, 66, 362, 482, 620.01, 620.4, 439/638
See application file for complete search history.

(56) References Cited

U.S. PATENT DOCUMENTS

| | | |
|---|---|---|
| 6,636,058 B2 | 10/2003 | Lyford |
| 6,781,391 B2 | 8/2004 | Reed |
| 6,888,361 B1 | 5/2005 | Engquist |
| 7,118,393 B1 * | 10/2006 | Pupkiewicz et al. ............ 439/91 |
| 7,291,035 B2 * | 11/2007 | Rose et al. .................... 439/362 |
| 7,722,375 B2 * | 5/2010 | Hagen et al. .................. 439/310 |

OTHER PUBLICATIONS

Spirit® Compression Test Probes, p. 4, Samtec Test Solutions Design Guide, Feb. 2009, 16 pages.

* cited by examiner

*Primary Examiner* — Khiem Nguyen
(74) *Attorney, Agent, or Firm* — William K. Bucher; Marger Johnson & McCollom, PC

(57) ABSTRACT

A connector has a housing with an aperture formed therein having one portion larger than the other portion. The housing is mounted on the device under test with the housing positioned over a plurality of electrical contacts. An electrical load is positioned within the larger aperture of the housing and has a plurality of resistors disposed adjacent to an electrical contact assembly. A resilient member is positioned between the electrical load and the device under test such that a force directed on the electrical load compresses the resilient member to allow contact between a plurality of electrical contacts of the electrical contact assembly and the plurality of the electrical contacts on the device under test. Removing the force decompresses the resilient member and disconnects the plurality of contacts of the electrical contact assembly from the plurality of electrical contacts of the device under test.

20 Claims, 16 Drawing Sheets

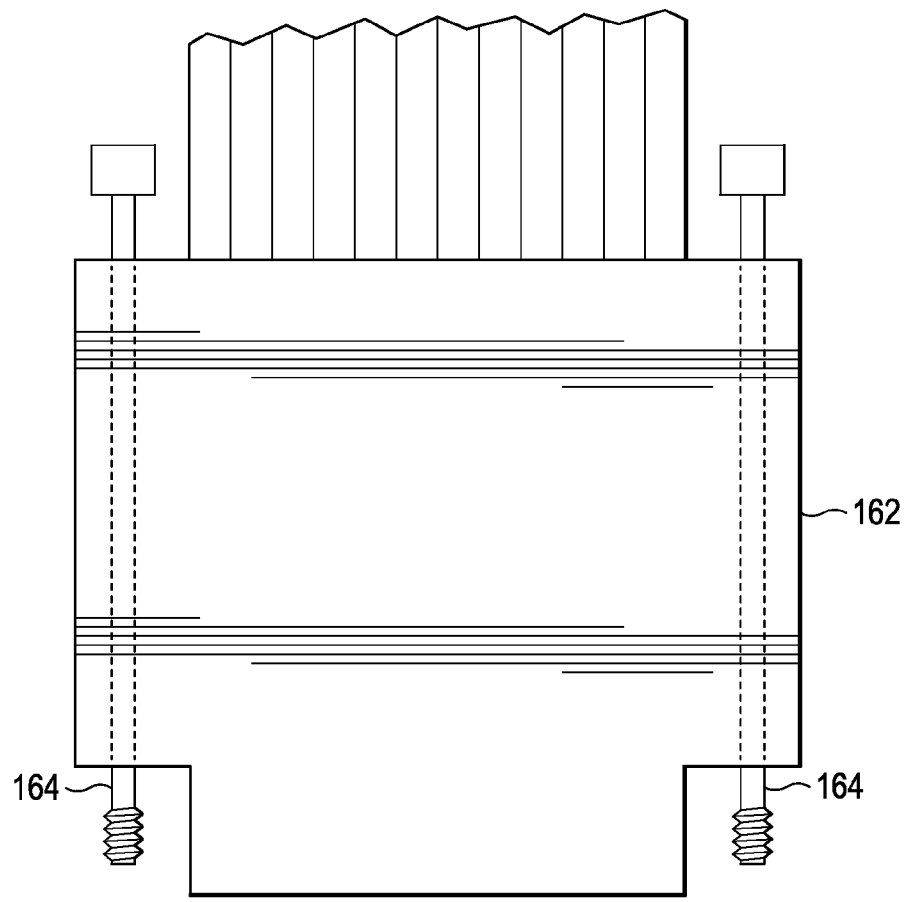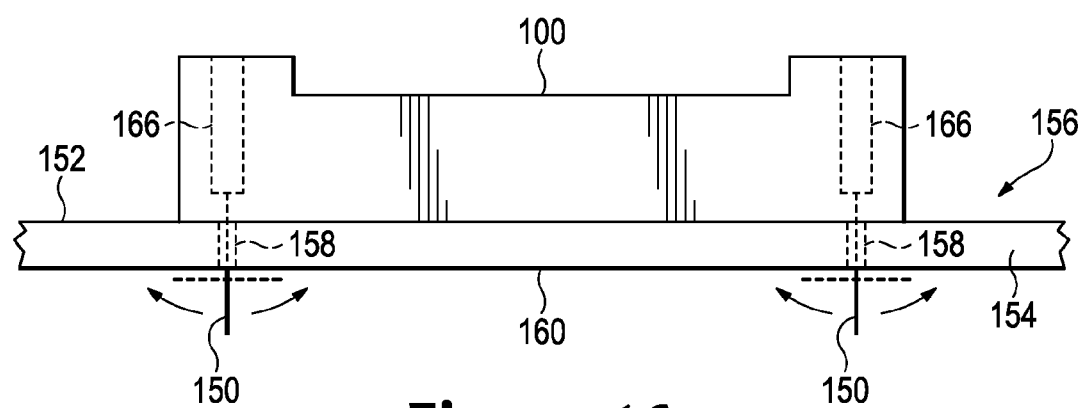
Figure 16

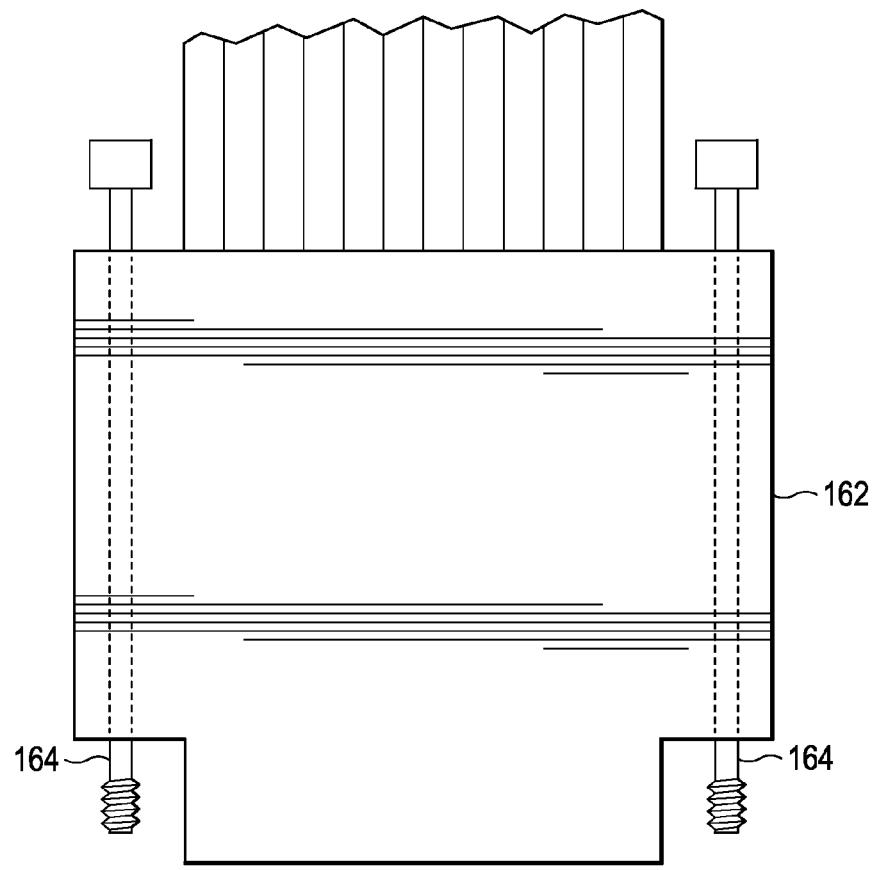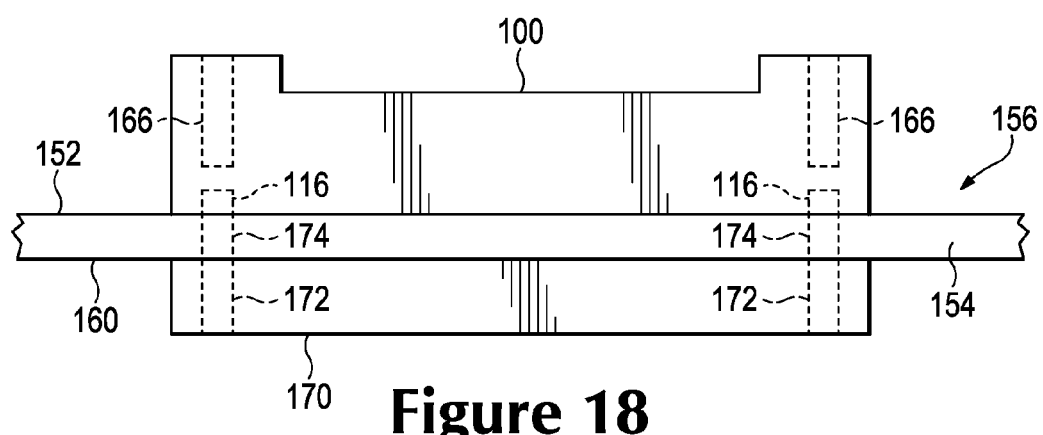
Figure 18

CONNECTOR FOR SELECTIVELY COUPLING AN ELECTRICAL LOAD TO A DEVICE UNDER TEST

BACKGROUND OF THE INVENTION

One of the problems with making high speed measurements with a logic analyzer probe or a mixed signal oscilloscope probe is the probe interface that perturbs the system under test (DUT). Generally, there are two types of probe interfaces, a connectorless probe interface and a connector probe interface. The connectorless probe interface has electrical contacts in a probe head that mate with corresponding electrical contacts mounted on the DUT, such as described in U.S. Pat. Nos. 6,888,361 and 6,781,391, which are incorporated herein by reference. Connector type probe interfaces have a receptacle portion that is mounted on the DUT. The receptacle portion has electrical contacts that mate with corresponding electrical contacts on the DUT. A plug portion having electrical contacts corresponding to the electrical contacts of the receptacle portion is mounted on the probe head and mates with the receptacle portion.

Both types of interfaces have unterminated stubs that reflect energy back into the device under test. Electrical stubs can impact the circuit being probed, so probe designers seek to minimize the stubs. However, existing probing methods place input resistors approximately 0.100 inches from the DUT contact points of the circuit to be probed, creating a 'stub' on the probed circuit. Two elements contribute to the 'stub length': (1) the length of the electrical contacts connected to the electrical contacts on the DUT, and (2) limitations of placing resistors close to the edge of the circuit board of the probe head. The length of the time delay in the compliant contact is one of the factors that limit the speed at which the probe can be used.

In previous implementations of logic analyzer probes, the input resistors have resided on a circuit board in the probe head, and the compliant electrical contacts come into contact with the edge of the circuit board. The length of the contacts and the amount the resistors are set back from the edge of the circuit board both contribute to the unterminated stub length. The distance that the resistors are set back from the edge of the circuit board is determined by circuit board manufacturing constraints. In addition, the edge wrap on the circuit board produces an edge that is somewhat rough and departs from planarity because of the process of routing and plating the laminated circuit board edge.

One connector type probe interface is called a MICTOR® connector, manufactured and sold by Tyco Electronics, Corp., Harrisburg, Pa. A MICTOR connector has a plug and closely mating receptacle. The electrically conductive lines in the plug and receptacle are contained in mating housings. The ends of the electrically conductive lines extending from the bottom of the receptacle are bent at an angle to form contact pads for soldering to parallel rows of conductive pads on the surface of the DUT. The ends of the electrically conductive lines at the other end of the receptacle form electrical contacts that mate with corresponding electrical contacts in the plug when the closely mating plug and receptacle are connected together. Electrical elements, such as resistors, may be mounted in the logic analyzer probe head between the MICTOR plug and additional circuitry in the probe head to provide electrical isolation for the device under test.

Another example of a connector type probe interface is a Spirit® Compression Test Probe, manufactured and sold by Samtec, Inc., New Albany, Ind. The Spirit® Compression Test Probe has mounting brackets positioned on either side of parallel rows of contact points on a circuit board of the DUT. Parallel rows of passive resistors corresponding to the parallel rows of contact points on the circuit board are embedded in a connector housing that is positioned between the mounting brackets. Each passive resistor is secured to a lower spring contact and an upper spring contact with the lower spring contact engaging one of the contact points on the circuit board and the upper spring contact engaging a corresponding contact point in a probe head. The stub length of the lower spring contact is 0.100 inches.

SUMMARY OF THE INVENTION

According, the present invention is directed to a connector for selectively coupling an electrical load to a device under test. The connector has a housing with an aperture formed therein that has one portion larger than the other portion. The housing is mounted on the device under test with the housing positioned over a plurality of electrical contacts disposed on the device under test and the larger portion of the aperture disposed toward the device under test. An electrical load is positioned within the larger aperture of the housing and has a plurality of resistors positioned on or through a planar body and at least a first electrical contact assembly. Each resistor has a pair of opposing electrical contacts and each electrical contact is exposed at a respective surface of the planar body. The first electrical contact assembly has opposing surfaces with a plurality of electrical contacts exposed at the respective opposing surfaces. Each electrical contact exposed at one opposing surface is coupled to a corresponding electrical contact exposed at the other opposing surface. The resistive load and the first electrical contact assembly mate with each other with the plurality of electrical contacts exposed at one surface of the planar body and the plurality of electrical contact exposed at one surface of the first electrical contact assembly contacting each other.

A resilient member positioned between the electrical load and the device under test such that a force directed on the electrical load through the aperture of the housing compresses the resilient member to allow contact between the plurality of electrical contacts exposed on the other surface of the first electrical contact assembly and the plurality of the electrical contacts on the device under test. Removing the force directed on the electrical load decompresses the resilient member and disconnects the plurality of contacts of the first electrical contact assembly from the plurality of electrical contacts of the device under test.

The connector may further include a second electrical contact assembly having opposing surfaces with a plurality of electrical contacts exposed at the respective opposing surfaces. Each electrical contact exposed at one opposing surface electrically is coupled to a corresponding electrical contact exposed at the other opposing surface. The second electrical contact assembly mates with the planar body with the plurality of electrical contacts exposed at one surface of the second electrical contact assembly mating with respective electrical contacts exposed at the other surface of the planar body.

The connector may have first and second recesses with each respective recess formed in one of opposing sidewalls of the larger portion of the aperture of the housing. First and second tabs are formed on opposing ends of the electrical load that engage the respective first and second recess of the opposing sidewalls of the larger aperture of the housing. Conversely, the connector may have first and second tabs with each respective tab formed in one of opposing sidewalls of the larger portion of the aperture of the housing. First and second recesses are formed on opposing ends of the electrical load that engage the respective first and second tabs of the opposing sidewalls of the larger aperture of the housing. The housing may be secured to the device under test by screws passing through the device under test. The housing may also be secured to the device under test by wires extending from the housing and through the device under test and secured to the opposing side thereof.

The planar body of the resistive load may be a sheet formed of an electrically insulating material having a plurality of apertures formed therein with each of the apertures receiving one of the plurality of resistors. The planar body may also be a ceramic substrate having the plurality of resistors formed thereon with each resistor having electrical contacts formed on opposing surfaces of the ceramic substrate.

At least one of the first and second electrical contact assemblies may comprise a flex circuit. Additionally, at least one of the first and second electrical contact assemblies may be an enclosure having compressible spring contacts disposed therein. Further, at least one of the first and second electrical contact assemblies may comprise an elastomeric material having electrically conductive contact there through.

The resilient member may comprise compression springs or an elastomeric member. The compression springs may be positioned at the corners of the electrical load. The elastomeric member may be a plurality of elastomeric spacers disposed around the periphery of the electrical load. The elastomeric member may also be serpentine shaped having raised and recessed elements disposed in a slot formed at the periphery of the electrical load with the raised portion extending from the electrical load. The resilient member may further be bumps formed in the flexible substrate of the first electrical conductive element of the electrical load.

The objects, advantages and novel features of the present invention are apparent from the following detailed description when read in conjunction with appended claims and attached drawings.

BRIEF DESCRIPTION OF THE DRAWINGS

FIG. 16 is a side view of a housing secured to a device under test in a connector for selectively coupling an electrical load to a device under test.

FIG. 18 is a side view of a housing secured to a device under test using a bolster in a connector for selectively coupling an electrical load to a device under test.

DETAILED DESCRIPTION

Figure 1:
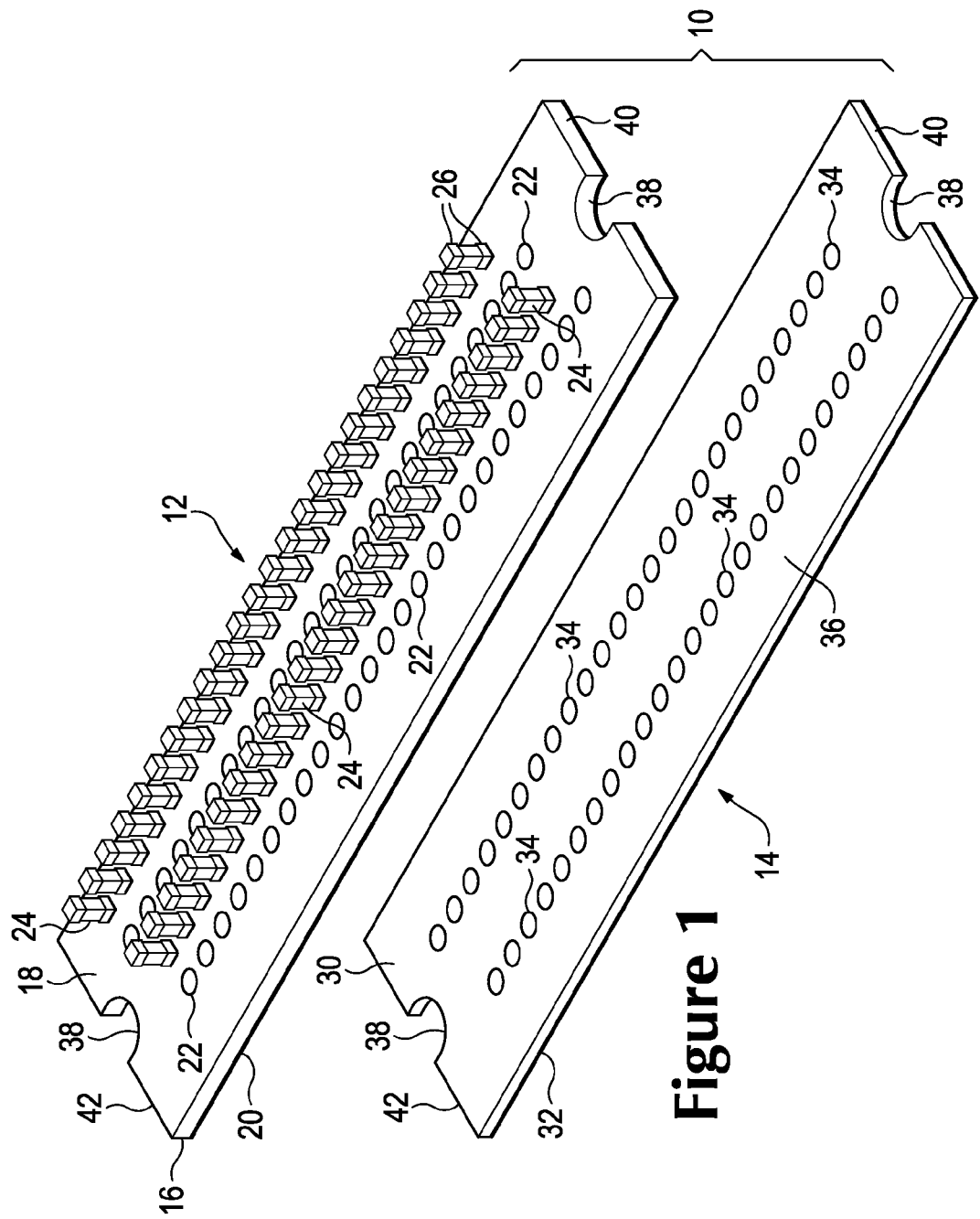
FIG. 1 is a perspective view of a first embodiment of an electrical load in a connector for selectively coupling an electrical load to a device under test.

The connector of the present invention has a housing having a movable electrical load therein that is selectively coupled to a device under test. Referring to FIG. 1, there is shown an exploded perspective view of an electrical load 10 having a resistive load 12 and an electrical contact assembly 14. The resistive load 12 may be formed as a planar body 16 having opposing surfaces 18 and 20 using a non-conductive material, such a plastic, elastomer, and the like. Apertures 22 are formed through the planar body 16 that extend to the opposing surfaces 18, 20. Discrete resistive elements 24 having electrical contacts 26 at opposing ends thereof are disposed in the apertures 22 with the electrical contacts 26 of the discrete resistive elements 24 exposed at the opposing surfaces 18, 20 of the planar body 16. Discrete resistive elements 24 that are suitable for use in electrical load 10 include the CRCW0402 and CRCW0201 Thick Film, Rectangular Chip Resistors, manufactured and sold by Vishay Intertechnolgy, Inc., Malvern, Pa. A planar body 16 formed of elastomer preferably should have a durometer of approximately 70 (Shore A) in the current embodiment in order to both retain the resistive elements 24 and permit individual compliance of each resistive element 24. However, a durometer ranging from approximately 50 to approximately 100 would also be suitable.

The electrical contact assembly 14 has opposing surfaces 30, 32 with electrical contacts 34 exposed at the opposing surfaces 30, 32. Each electrical contact 34 exposed at one of the opposing surfaces 30, 32 is electrically coupled to a corresponding electrical contact 34 exposed at the other opposing surface. The electrical contacts 34 exposed at the opposing surfaces 30, 32 correspond to the electrical contacts 26 of the resistive elements 24 exposed at the opposing surfaces 18, 20 of the planar body 16. In one embodiment, the electrical contact assembly 14 is formed of a flex circuit material 36 having corresponding electrical contacts 34 formed on the opposing surfaces 30, 32 and coupled together by electrically conductive through vias. Preferably, the flex circuit material 36 has a thickness on the order of 0.010 inches.

The electrical contact assembly 14 and the planar body 16 of the resistive load 12 have recesses 38 formed in opposing sidewalls 40, 42 that mate with corresponding tabs in a housing, to be described below. The recesses 38 and the tabs align the electrical load 10 within the housing.

Figure 2:
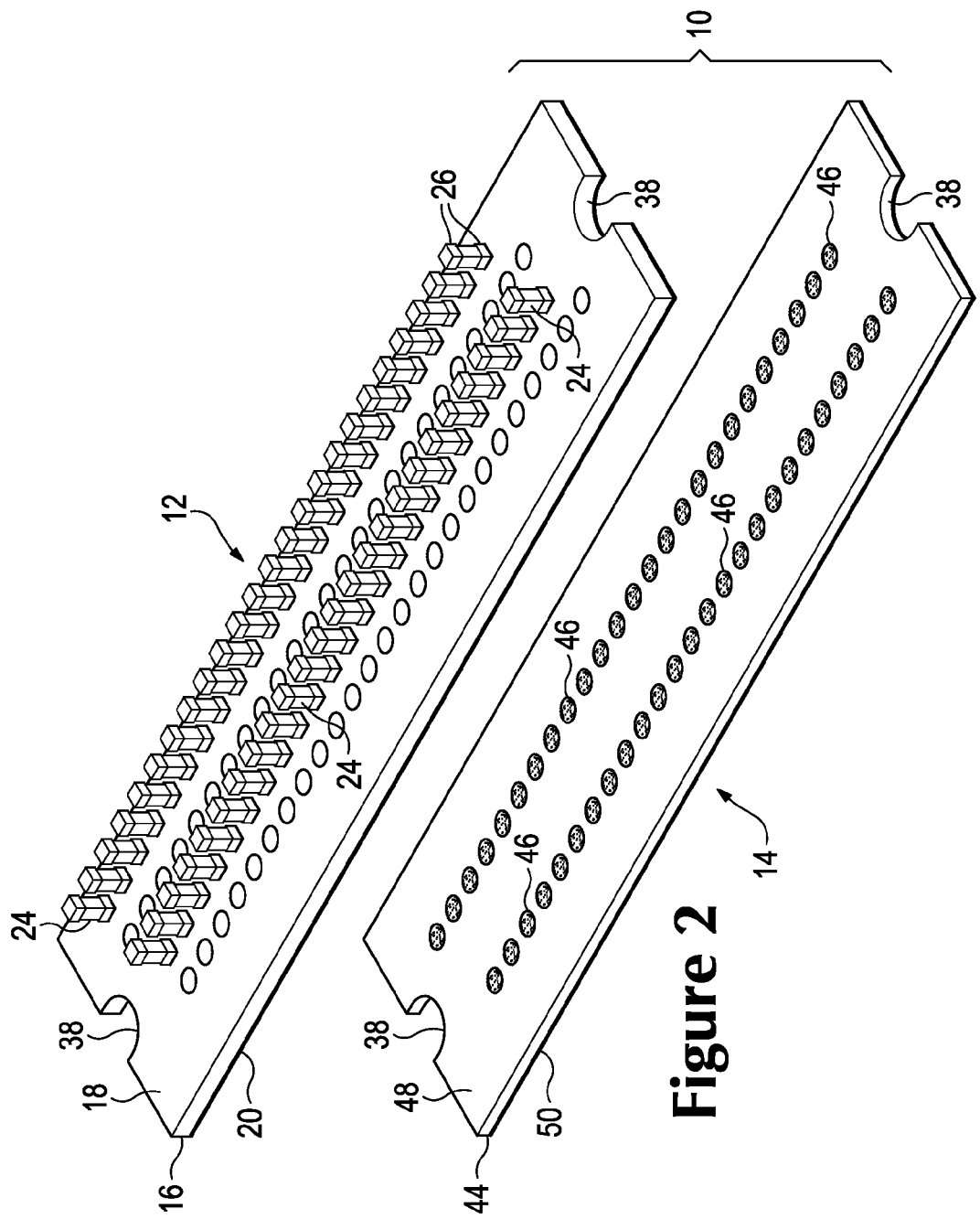
FIG. 2 is an exploded perspective view of a second embodiment of an electrical load in a connector for selectively coupling an electrical load to a device under test.

FIG. 2 shows an exploded perspective view of a second embodiment of the electrical load 10. In this embodiment the resistive load 12 is the same as described for FIG. 1. The electrical contact assembly 14 is formed of an elastomeric material 44 having electrically conductive elastomeric contacts 46 formed therein. The electrically conductive elastomeric contacts 46 are formed of electrical wires extending to opposing surfaces 48, 50 of the elastomeric material 44. The electrically conductive elastomeric contacts 46 exposed at the opposing surfaces 48, 50 correspond to the electrical contacts 26 of the resistive elements 24 exposed at the opposing surfaces 18, 20 of the planar body 16.

Figure 3A:
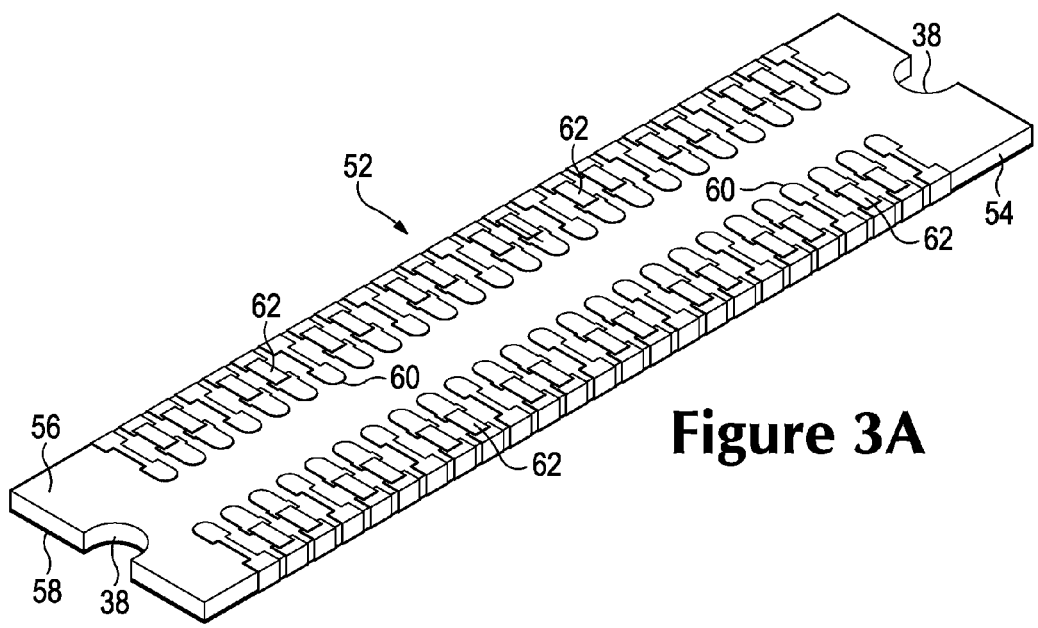
FIGS. 3A and 3B are perspective views of a resistive load in the electrical load in a connector for selectively coupling an electrical load to a device under test.
Figure 3B:
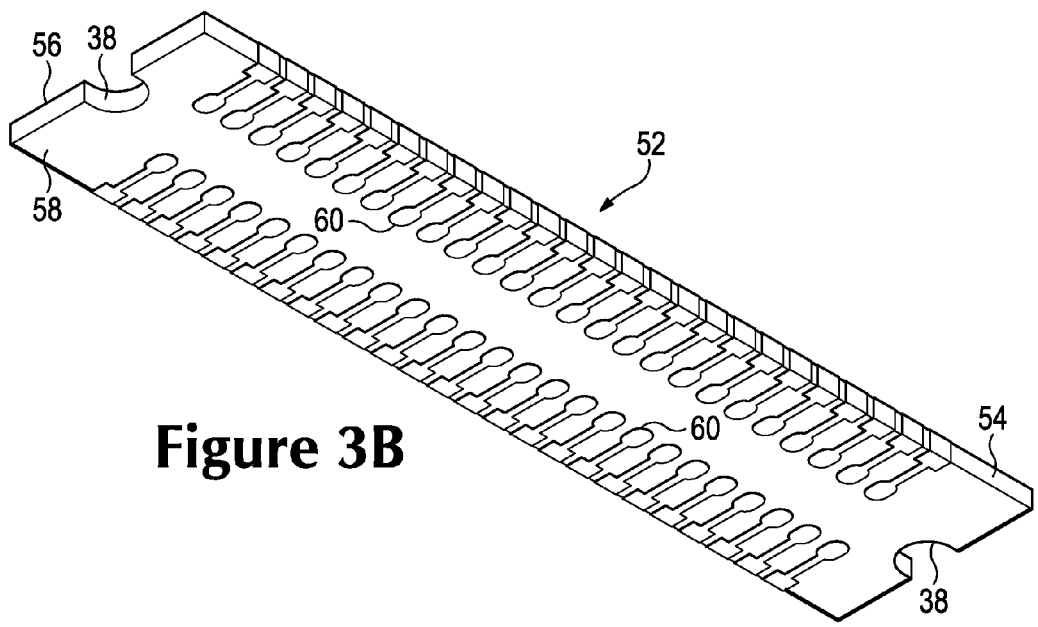

FIGS. 3A and 3B shows perspective top and bottom views of another resistive load 52 disposed on a planar body 54 that may be formed as a substrate using a ceramic material or the like. The planar ceramic substrate 54 has opposing surfaces 56, 58 with electrical contacts 60 formed on the opposing surfaces 56, 58. Resistive elements 62 are formed on the planar ceramic substrate 54 with each end of the resistive elements 62 being coupled to corresponding electrical contacts 60 on the opposing surfaces 56, 58 of the planar ceramic substrate 54. The resistive elements 62 and electrical contacts 60 are formed using well-known thick film, thin film, or other technologies. Alternately, the electrical contacts 60 may be formed on the opposing side surfaces of the planar ceramic substrate 54 with this alternative being equivalent to the electrical contacts 60 being formed on the opposing flat surfaces 56, 58 of the planar ceramic substrate 54. A further alternative has the resistive elements 62 formed of discrete resistors with one end of each discrete resistor connected to an electrical contact 60 formed on one of the opposing side surfaces of the planar ceramic substrate 54 and the other end of each discrete resistor 62 connected to an electrical contact 60 formed on the other of the side surfaces of the planar ceramic substrate 54.

Figure 4:
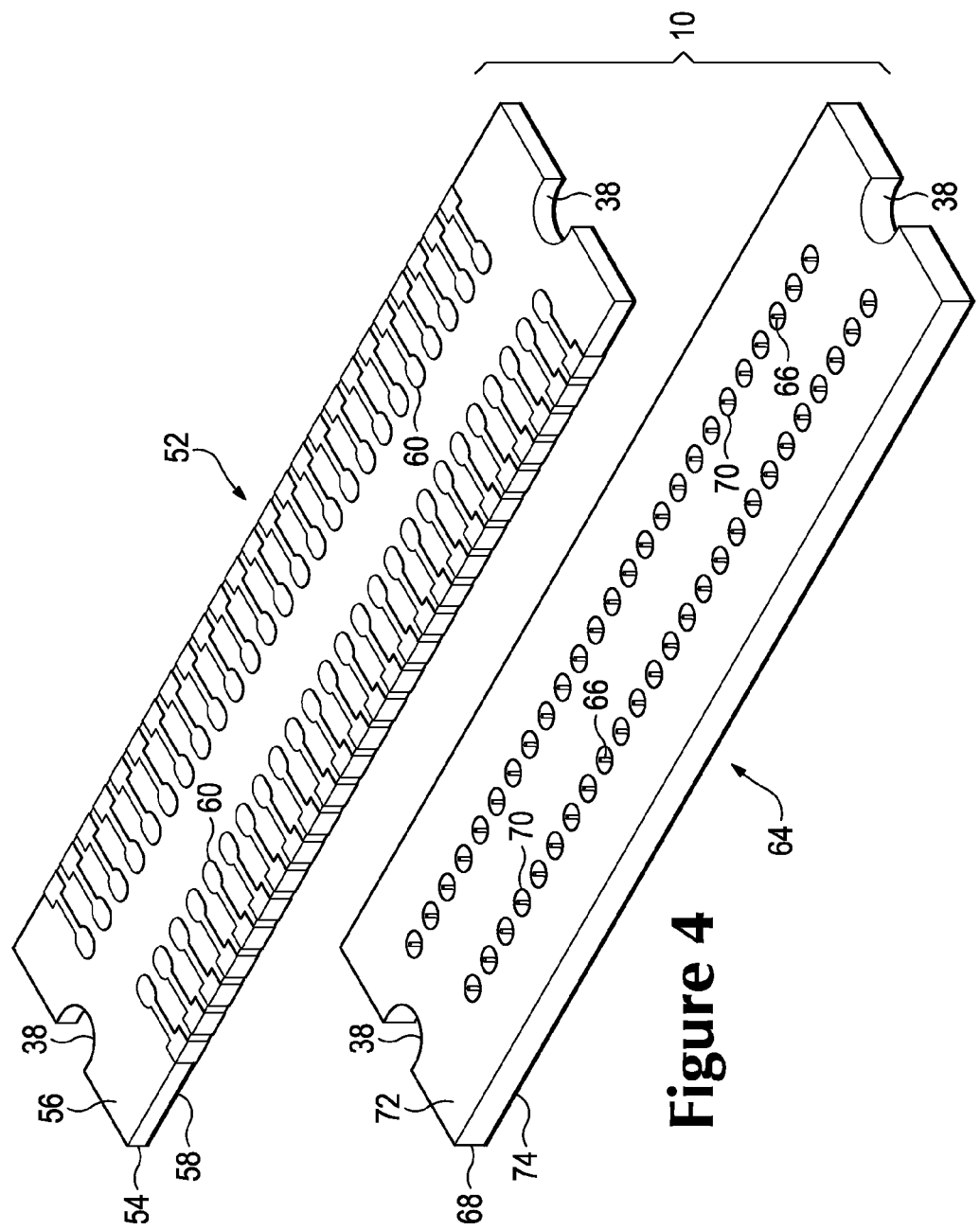
FIG. 4 is an exploded perspective view of a third embodiment of an electrical load in a connector for selectively coupling an electrical load to a device under test.

FIG. 4 shows an exploded perspective view of a third embodiment of the electrical load 10. In this embodiment the resistive load 52 is the same as described for FIGS. 3A and 3B. The electrical contact assembly 64 is formed of metal spring electrical contacts 66 disposed in a housing 68 with the ends of the metal spring electrical contacts extending from apertures 70 formed in the opposing surfaces 72, 74 of the electrical contact assembly 64. An example of a metal spring electrical contacts usable in the electrical contact assembly 64 are RC Spring Probes manufactured and sold by Ardent Concepts, Inc., Hampton Beach, N.H. Preferably, the free height of the metal spring electrical contact is 0.036 inches. The compressed height is 0.031 inches which is set by the thickness of the housing 68 of the electrical contact assembly 64. The metal spring electrical contacts 66 exposed at the opposing surfaces 72, 74 correspond to the electrical contacts 60 exposed at the opposing surfaces 56, 58 of the planar ceramic substrate 54.

Figure 5:
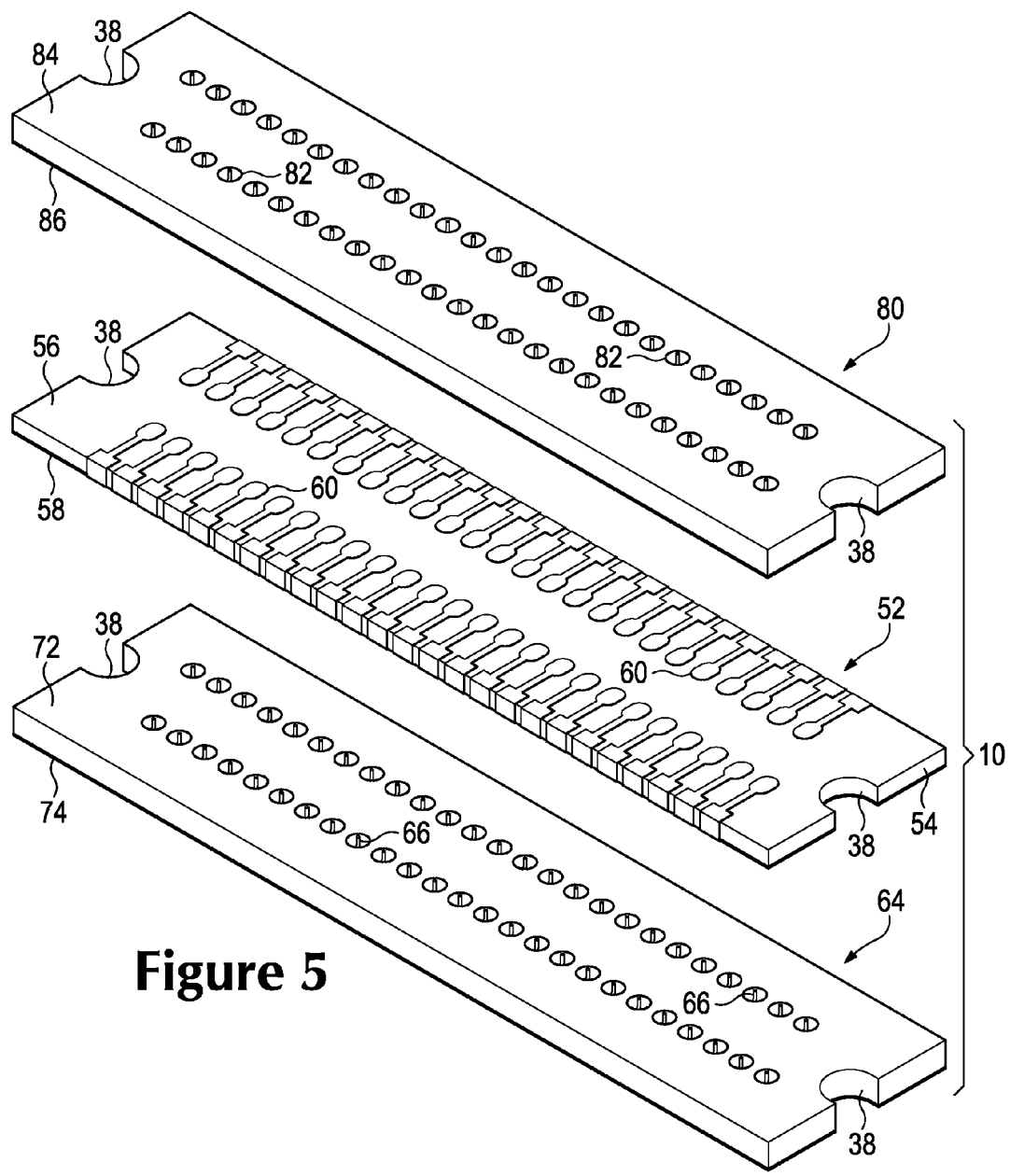
FIG. 5 is an exploded perspective view of a fourth embodiment of an electrical load in a connector for selectively coupling an electrical load to a device under test.

FIG. 5 is an exploded perspective view of a further embodiment of the electrical load 10 of the present invention. In this embodiment, a second electrical contact assembly 80 is added to the resistive load 52 and the electrical contact assembly 64. The electrical contact assembly 80 is the same as described in FIG. 4. The electrical contact assembly 80 has electrical contacts 82 exposed at opposing surfaces 84, 86 thereof that correspond to the electrical contacts 60 exposed on the opposing surfaces 56, 58 of the planar ceramic substrate 54 of the resistive load 52. The electrical contacts 82 on one of the surfaces 84, 86 of the electrical contact assembly 80 engage corresponding electrical contacts 60 on one of the surfaces 56, 58 the planar ceramic body 54. The electrical contacts 66 on one of the surfaces 72, 74 of the electrical contact assembly 64 engage corresponding electrical contacts 60 on the other of the opposing surfaces 56, 58 on the planar ceramic body 54.

Figure 6:
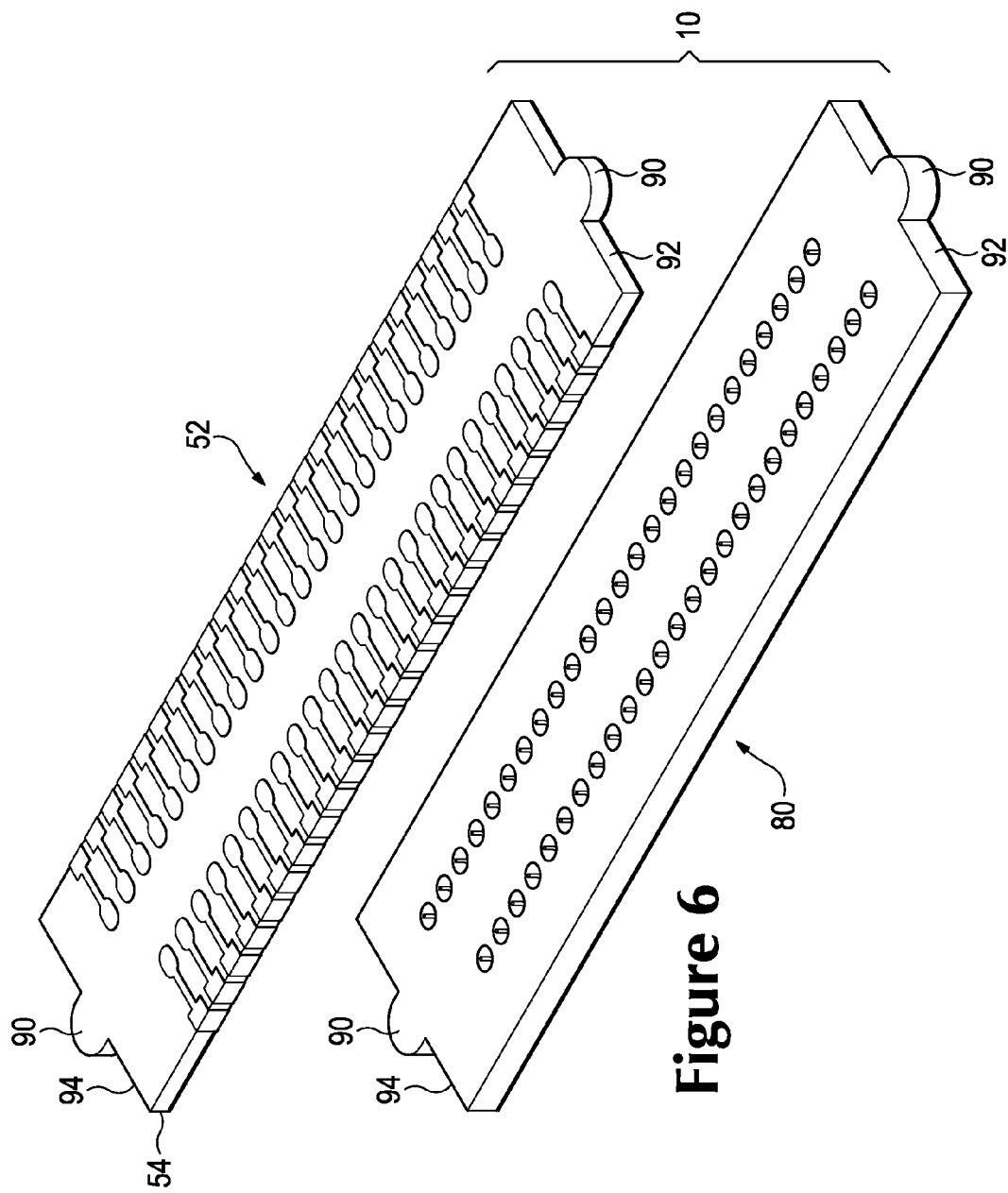
FIG. 6 is an exploded perspective view of an electrical load showing an alternate embodiment for aligning the electrical load in a housing in a connector for selectively coupling an electrical load to a device under test.

FIG. 6 is an exploded perspective view of the electrical load 10 showing an alternative embodiment for aligning the electrical contact assemblies 80 and the planar body 54 of the resistive loads 52 within a housing. The electrical contact assembly 80 and the planar body 54 have tabs 90 formed in opposing sidewalls 92, 94 that mate with corresponding recesses in a housing, to be described below.

Figure 7:
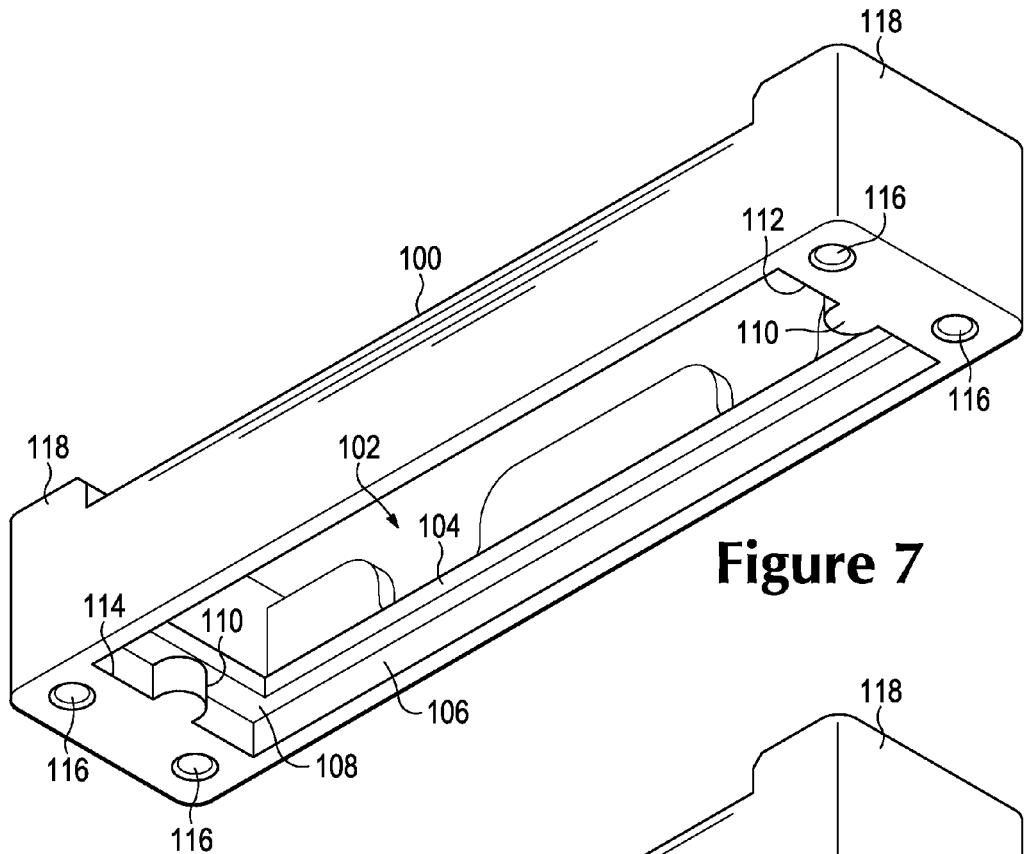
FIG. 7 is an underside perspective view of a housing showing a first alignment mechanism for an electrical load in a connector for selectively coupling an electrical load to a device under test.

FIG. 7 shows a bottom view of a housing 100 that receives the electrical load 10. The housing 100 has an aperture 102 formed therein having a smaller aperture 104 and a larger aperture 106 forming an overhang 108. Tabs 110 are formed in opposing sidewalls 112, 114 of the larger aperture 106 for engaging the recesses 38 formed in the electrical contact assembly 80 and the planar body 54 of the resistive loads 52 to align the electrical load 10 in the larger aperture 106 of the housing 100. Threaded apertures 116 are formed in end walls 118 of the housing 100 for receiving threaded screws.

Figure 8:
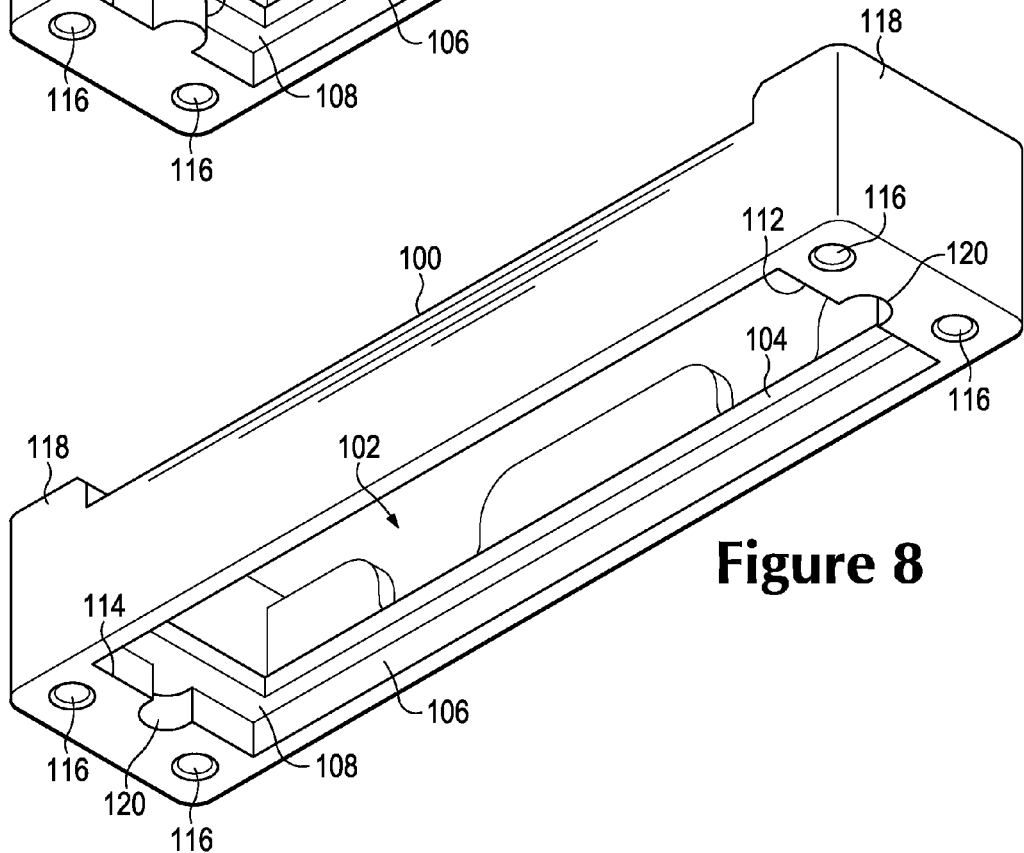
FIG. 8 is an underside perspective view of a housing showing a second alignment mechanism for an electrical load in a connector for selectively coupling an electrical load to a device under test.

FIG. 8 is a bottom view of the housing 100 illustrating an alternative embodiment for aligning the electrical load 10 in the housing 100. The housing 100 of FIG. 8 has recesses 120 formed in the opposing sidewalls 112, 114 of the larger aperture 106 for engaging the tabs 90 formed in the electrical contact assembly 80 and the planar body 54 of the resistive loads 52 to align the electrical load 10 in the larger aperture 106 of the housing 100. The structure of the housing 100 in FIG. 8 is the same as the structure of the housing of FIG. 7 with the exception of the recesses 120 formed in the opposing side walls 112, 114 of the large aperture 104.

Figure 9:
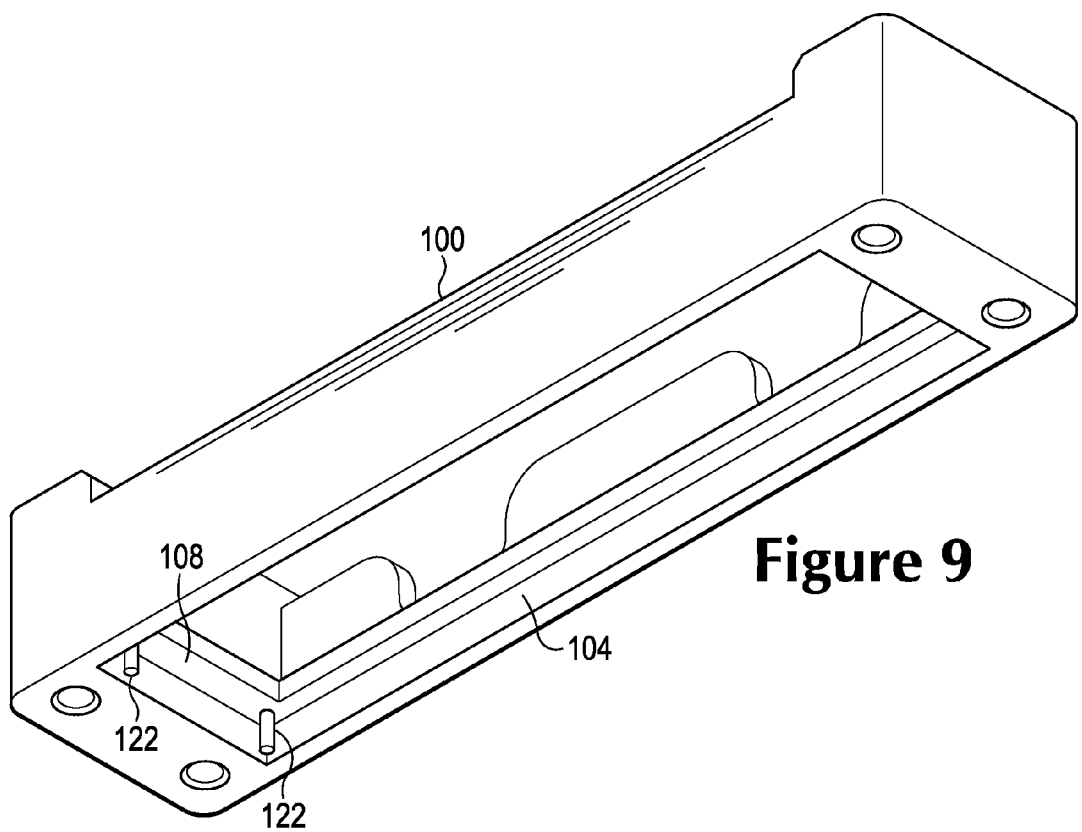
FIG. 9 is an underside perspective view of a housing showing a third alignment mechanism for an electrical load in a connector for selectively coupling an electrical load to a device under test.
Figure 10:
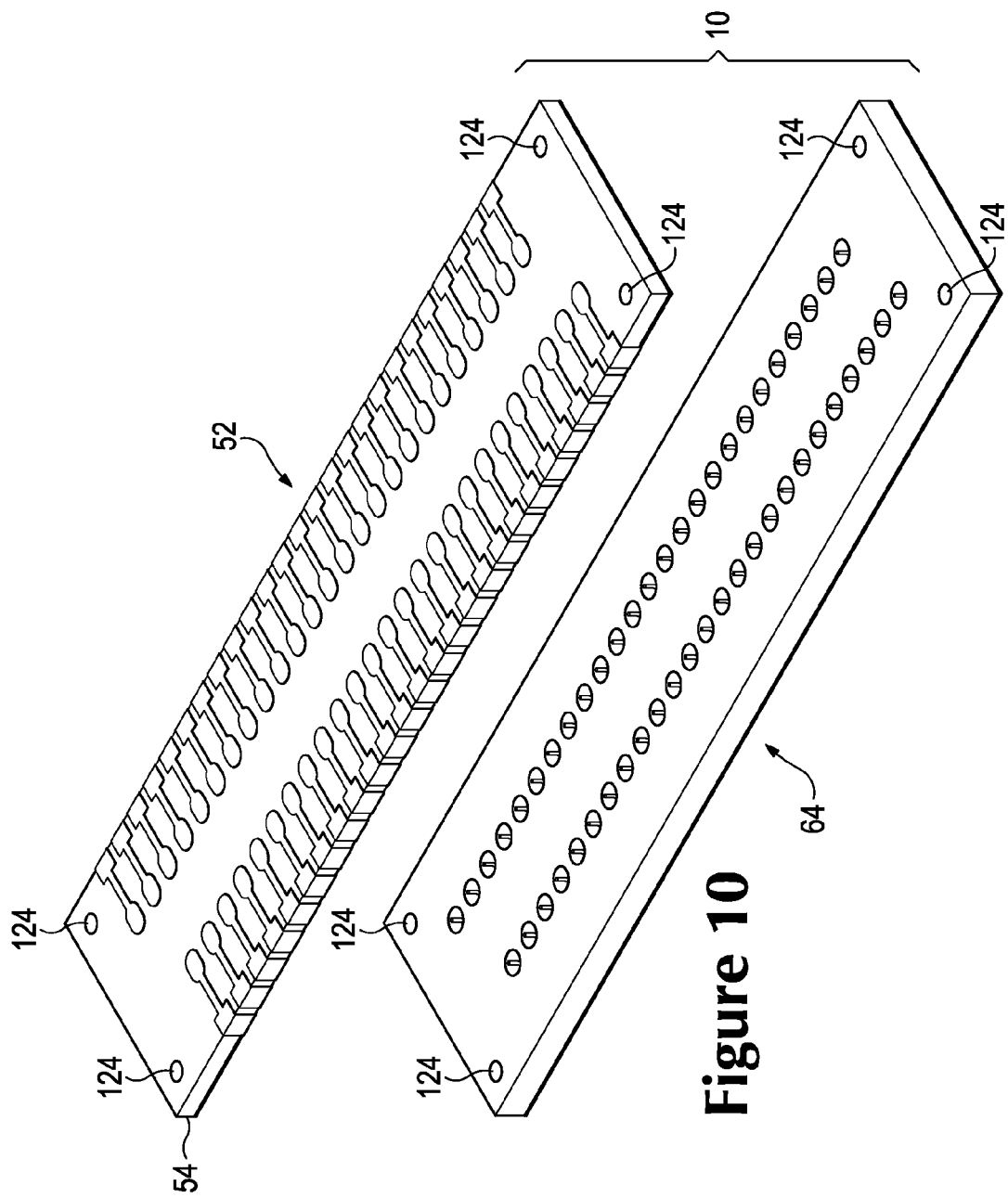
FIG. 10 is a perspective view of the electrical load showing another embodiment for aligning the electrical load in a housing in a connector for selectively coupling an electrical load to a device under test.

FIG. 9 is a bottom view of the housing 100 illustrating a further embodiment for aligning the electrical load 10 in the housing 100. The housing 100 of FIG. 9 has wires 122 extending downward from the overhang 108 adjacent to the corners of the larger aperture 106. The electrical contact assembly 64 and the planar body 54 of the resistive loads 52 in FIG. 10 have aperture 124 formed adjacent to the corners of the electrical contact assembly 64 and the planar body 54 that correspond to the wires 122 in the larger aperture 106. The wires 122 pass through the apertures 124 in the electrical contact assembly 64 and the planar body 54 to align the electrical load 10 in the larger aperture 106 of the housing 100.

Figure 11:
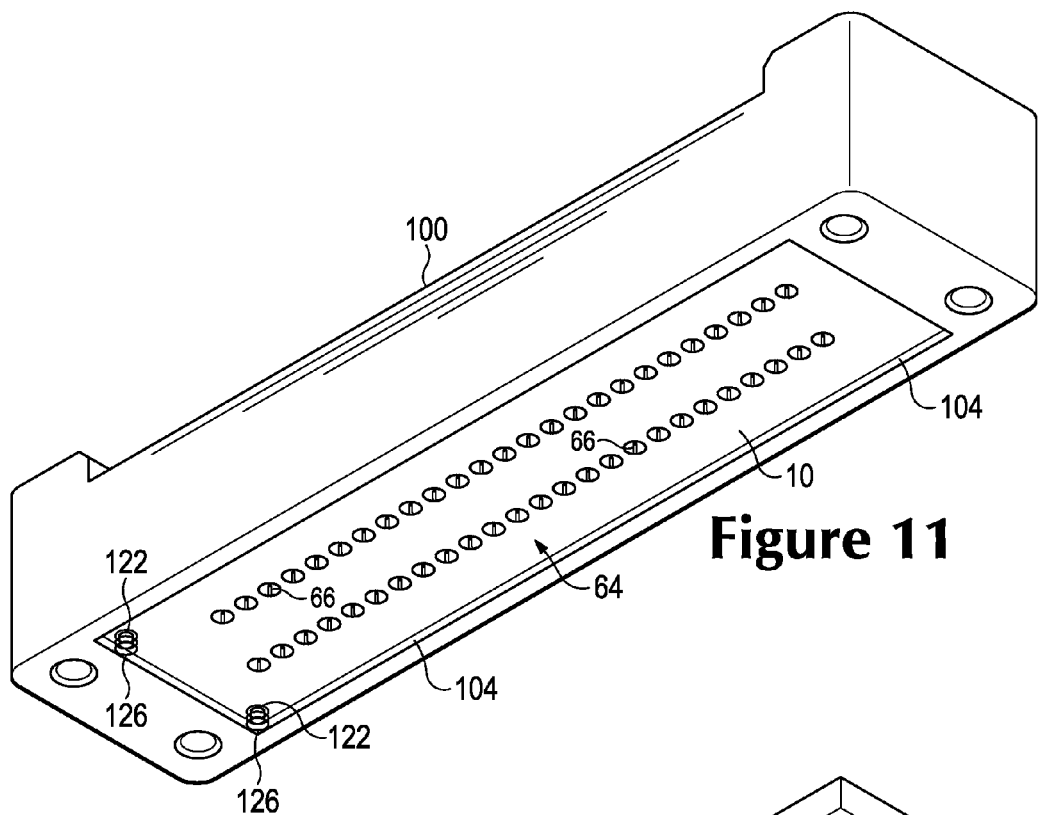
FIG. 11 is a perspective showing a first resilient member for positioning an electrical load above a device under test in a connector for selectively coupling an electrical load to a device under test.

Referring to FIG. 11, there is shown the electrical load 10 positioned within the larger aperture 106 of the housing 100. The wires 122 in the larger aperture 106 are shown passing through the apertures 124 in the electrical contact assembly 64 and the planar body 54 of the resistive loads 52. A resilient member in the form of compression springs 126 are positioned over the wires 122 and secured to the electrical load 10. When a downward force is applied to the electrical load 10 through the housing aperture 102, the compression springs 126 compress allowing the electrical contacts 66 of the electrical contacts assembly 64 to engage corresponding electrical contacts on a device under test.

Figure 12:
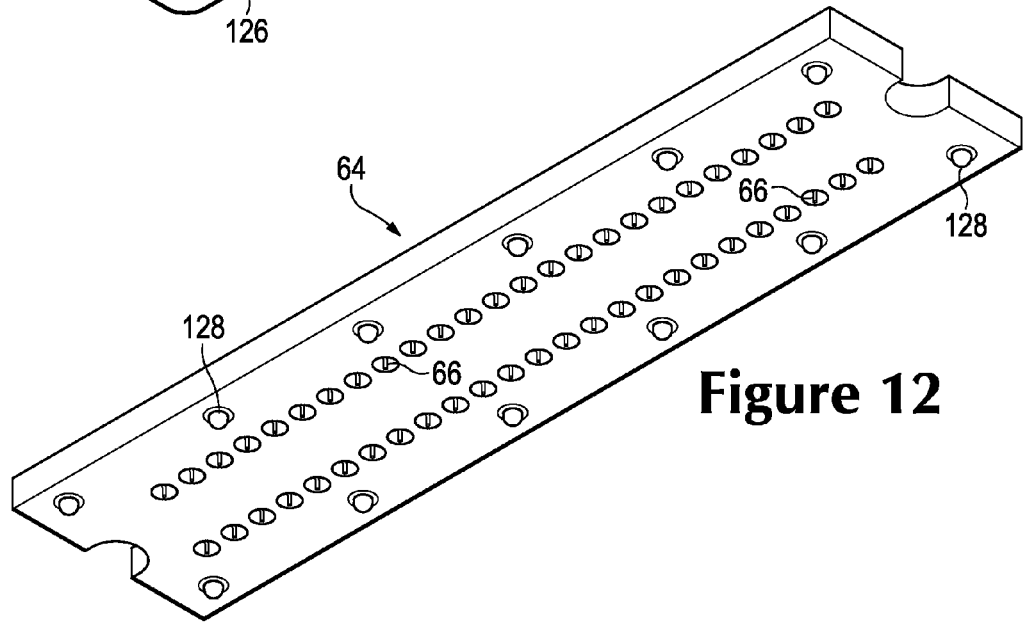
FIG. 12 is a perspective showing a second resilient member on an electrical contact assembly of the electrical load for positioning an electrical load above a device under test in a connector for selectively coupling an electrical load to a device under test.

Referring to FIG. 12, there is shown an alternative embodiment of a resilient member secured to the electrical contact assembly 64. Spacers 128 formed of elastomeric material are positioned adjacent to the periphery of the electrical contact assembly 64. A downward force applied to the electrical load 10 through the housing aperture 102 compresses the elastomeric spacers 128 allowing the electrical contacts 66 of the electrical contacts assembly 64 to engage corresponding electrical contacts on a device under test.

Figure 13:
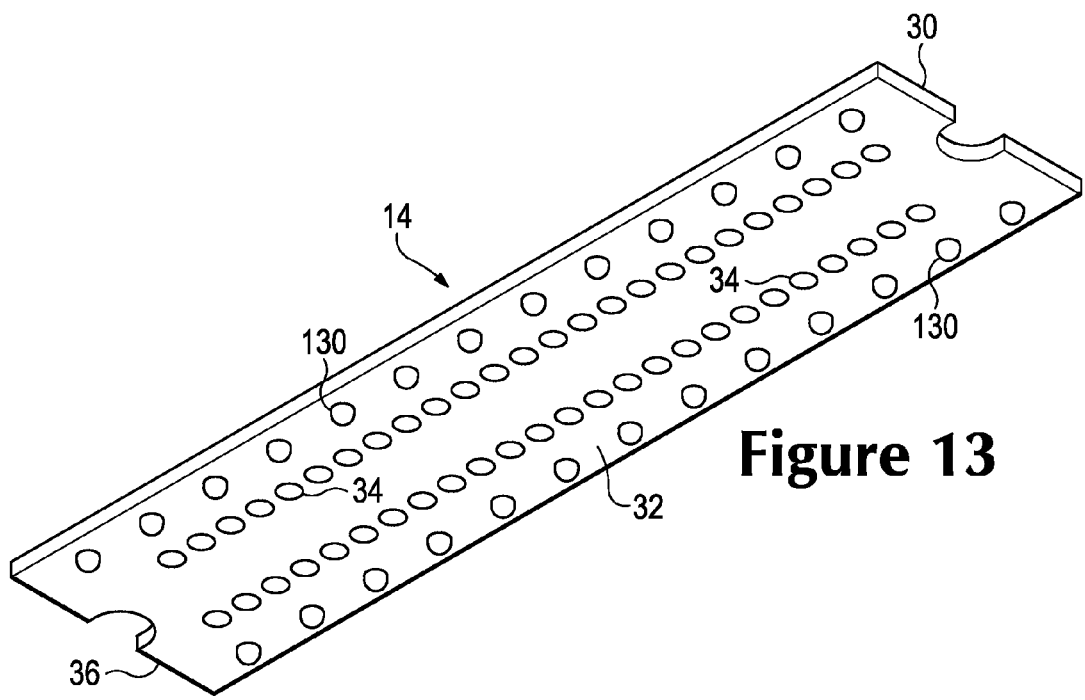
FIG. 13 is a perspective showing a third resilient member on an electrical contact assembly of the electrical load for positioning an electrical load above a device under test in a connector for selectively coupling an electrical load to a device under test.

Referring to FIG. 13, there is shown a further embodiment of a resilient member formed in the flex circuit material 36 of the electrical contact assembly 14. The resilient member is a series of raised bumps 130 formed along the periphery on the surface 32 of the flex circuit material 36. Concave recesses corresponding to the bumps 130 are formed on the surface 30 of the flex circuit material 36. A downward force applied to the flex circuit material 36 of the electrical load 10 through the housing aperture 102 compresses the bumps 130 allowing the electrical contacts 34 of the electrical contacts assembly 14 to engage corresponding electrical contacts on a device under test.

Figure 14:
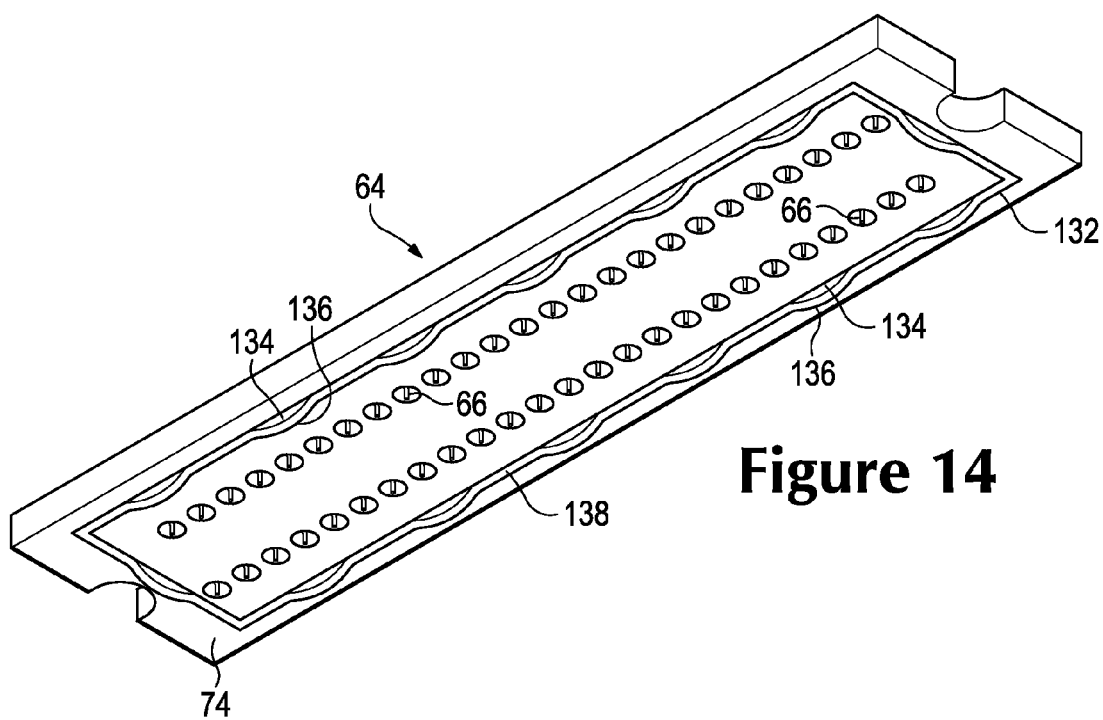
FIG. 14 is a perspective showing a fourth resilient member on an electrical contact assembly of the electrical load for positioning an electrical load above a device under test in a connector for selectively coupling an electrical load to a device under test.

Referring to FIG. 14, there is shown another embodiment of a resilient member secured to the electrical contact assembly 64. A groove 132 is formed about the periphery of the electrical contact assembly 64 into which is secured a serpentine shaped elastomeric member 134. Raised portions 136 of the serpentine elastomeric member 134 extend above the surface 74 of the electrical contact assembly 64. Recessed portions 138 of the serpentine elastomeric member 134 are positioned in the grove 132. A downward force applied to the electrical load 10 through the housing aperture 102 compresses the raised portions 136 of the serpentine elastomeric member 134 allowing the electrical contacts 66 of the electrical contacts assembly 64 to engage corresponding electrical contacts on a device under test.

Even though the various alignment features of the electrical load 10 formed on or through the electrical contact assemblies and the planar bodies of the resistive loads are shown and described for specific alignment features, it is understood that the various alignment features may be implemented on or in the various configurations of the electrical contact assemblies and the planar bodies. Further, the compression spring 126 embodiment of the resilient member of FIG. 11 may be used with any of the embodiments of the electrical contact assemblies. The elastomeric resilient member embodiments 128, 134 of the resilient member of FIGS. 12 and 14 may be used with the embodiments of the electrical contact assemblies of FIGS. 2 and 4. The raised bumps 130 embodiment of the resilient member formed on the flex circuit material is used with the electrical contact assembly of FIG. 1.

Figure 15:
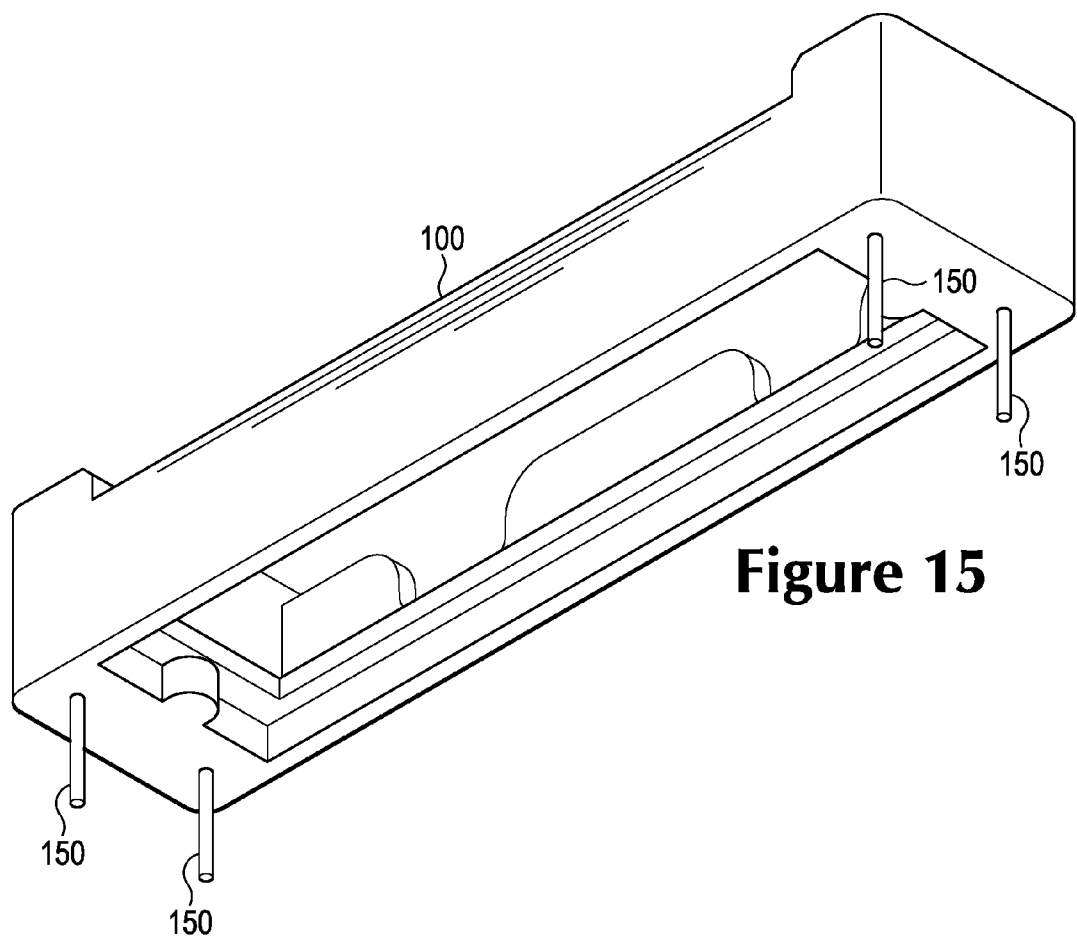
FIG. 15 is a perspective view of a mechanism for aligning and securing a housing to a device under test in a connector for selectively coupling an electrical load to a device under test.

Referring to FIG. 15, wires 150 are shown extending downward from the housing 100. The wires 150 are used to align and secure the housing 100 to a device under test. FIG. 16 shows a side view of the housing 100 mounted on an upper surface 152 of a circuit board 154 of a device under test 156. The wires 150 pass through apertures 158 formed in the circuit board 154 of the device under test 156 and extend past an opposing underside surface 160 of the circuit board 154. The wires 150 are bent at the opposing underside surface 160 and secured to the underside surface 160 of the circuit board 154 using well known securing means, such as solder, epoxy, and the like. A logic analyzer probe 162 is positioned in the housing 100 and screws 164 in the probe 162 engage and are secured in threaded apertures 166 in the housing 100.

Figure 17A:
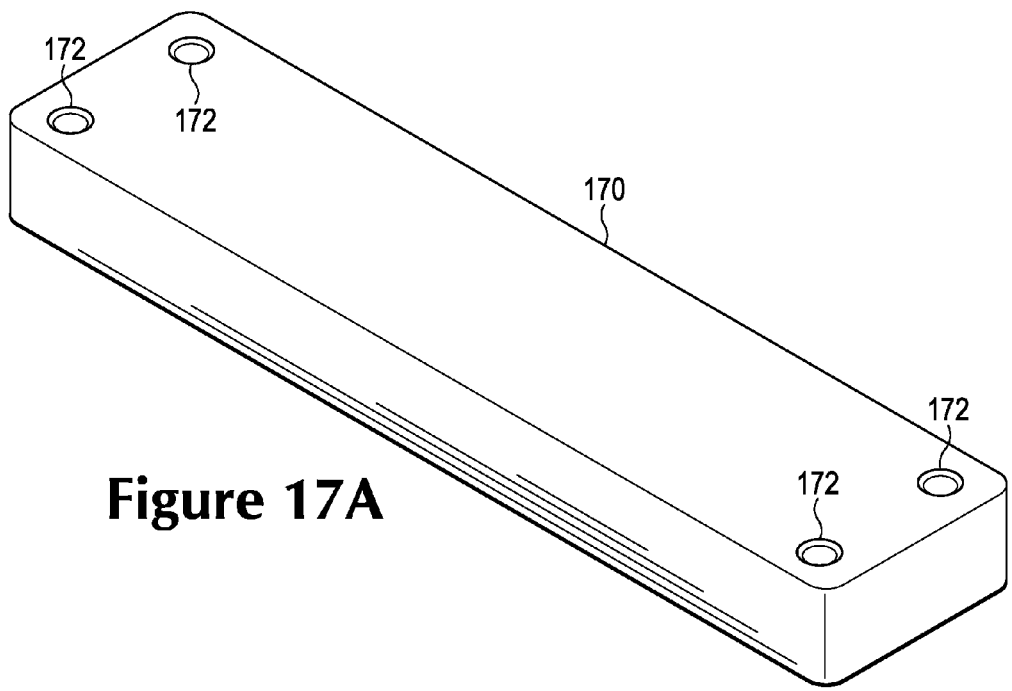
FIGS. 17A and 17B show perspective view of opposing surfaces of a bolster for securing a housing to a device under test in a connector for selectively coupling an electrical load to a device under test.
Figure 17B:
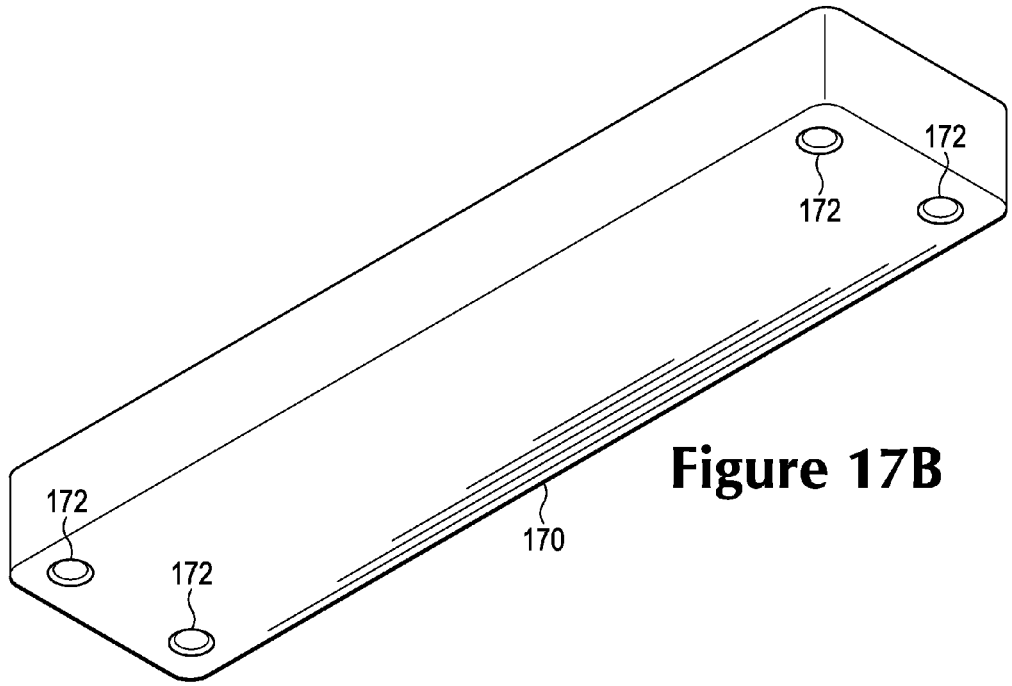

Referring to FIGS. 17A and 17B, and FIG. 18, there is shown perspective top and bottom views of a bolster 170 used for securing the housing 100 to the circuit board 154 of the device under test 156. The bolster 170 is formed of a hard material, such as plastic, or the like. The bolster 170 has apertures 172 form therethrough adjacent to the corners of the bolster 170. The bolster 170 is positioned on the underside surface 160 of the circuit board 154 beneath parallel rows of electrical contacts on the upper surface 152 of the circuit board 154 as shown in FIG. 18. The housing 100 is positioned on the upper surface 152 of the circuit board 154 with the aperture 102 formed in the housing positioned over electrical contacts on the circuit board 154. Threaded screws pass through the apertures 172 in the bolster 170 and apertures 174 in the circuit board 154 to engage the threaded apertures 116 in the housing. The logic analyzer probe 162 is positioned in the housing 100 and screws 164 in the probe 162 engage the threaded apertures 166 in the housing 100.

Figure 19:
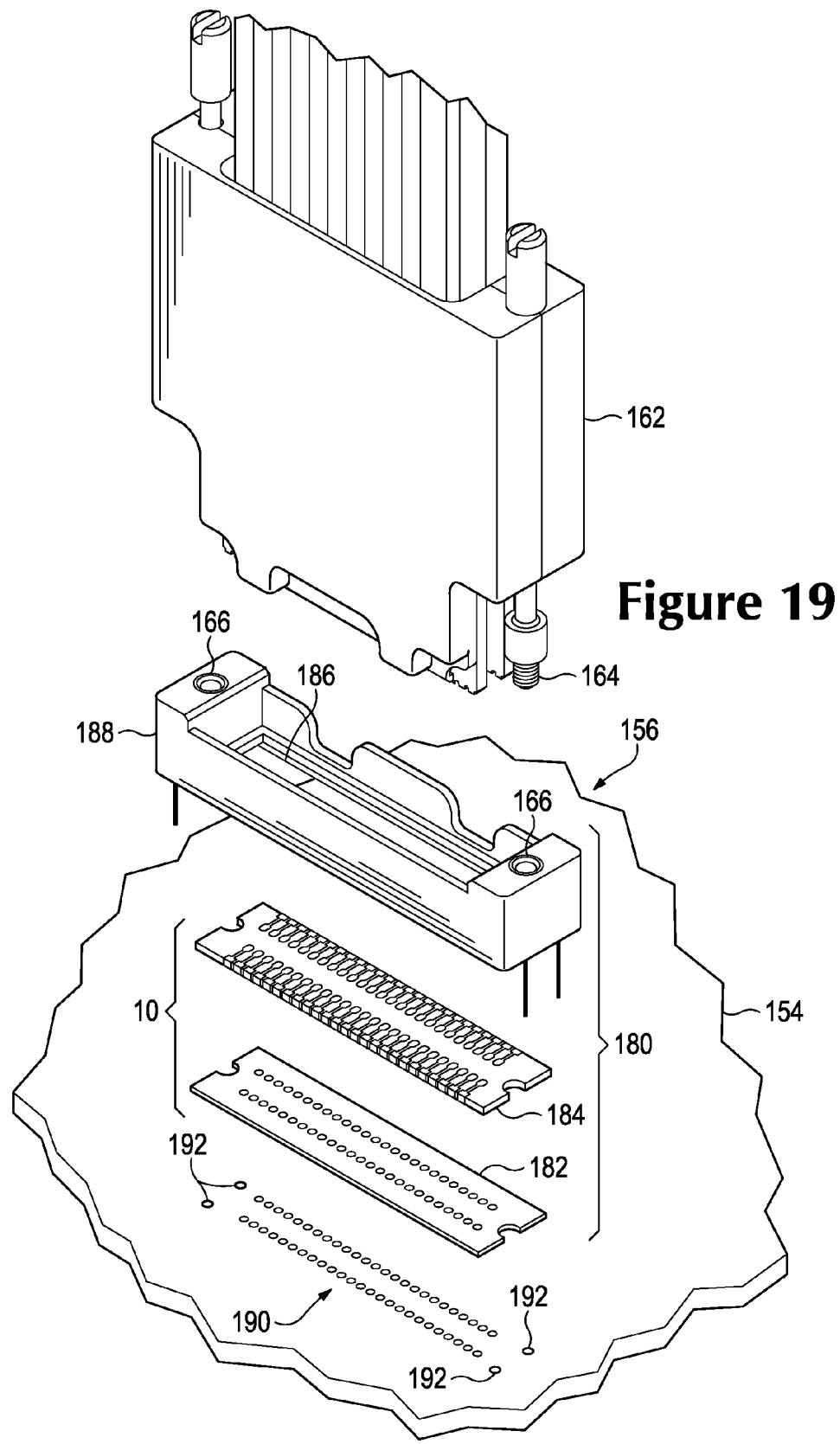
FIG. 19 is a perspective view of a connector for selectively coupling an electrical load to a device under test.

Referring to FIG. 19, there is shown a perspective view of one example of the connector 180 according to the present invention. The connector has an electrical load 10 consisting of at least one electrical contact assembly 182 and a resistive load 184. The electrical load 10 is positioned in an aperture 186 formed in the housing 188. The housing 188 is positioned over a plurality of electrical contacts 190 formed on the circuit board 154 of the device under test 156. Wires 150 extending from the underside of the housing 100 pass through apertures 192 in the circuit board 154 and are secured to the underside of the circuit board 154. The logic analyzer probe 162 is positioned in the housing 100. The logic analyzer probe 162 is inserted into the aperture 186 of the housing 188 producing a downward force directed on the electrical load 10 that compresses the resilient member on the underside 194 of the electrical contact assembly 182 to allow electrical contact between the plurality of electrical contacts 196 on the electrical contact assembly 182 and the plurality of electrical contacts 190 on the circuit board 154 of the device under test 156. The logic analyzer probe 162 is secured to the housing 188 by screws 164 in the probe 162 engaging the threaded apertures 166 in the housing 188.

It will be obvious to those having skill in the art that many changes may be made to the details of the above-described embodiments of this invention without departing from the underlying principles thereof. The scope of the present invention should, therefore, be determined only by the following claims

What is claimed is:

1. A connector for selectively coupling an electrical load to a device under test comprising:
 a housing having an aperture formed therein with one portion of the aperture larger than the other portion of the aperture and mounted on the device under test with the housing positioned over a plurality of electrical contacts disposed on a first surface of the device under test and the larger portion of the aperture disposed toward the device under test;
 an electrical load having a resistive load and at least a first electrical contact assembly with the resistive load having a plurality of the resistors being configured such that a least one of the configurations of the plurality of resistors is on and through a planar body with each resistor having a pair of opposing electrical contacts and each electrical contact being exposed at a respective surface of the planar body and the first electrical contact assembly having opposing surfaces with a plurality of electrical contacts exposed at the respective opposing surfaces with each electrical contact exposed at one opposing surface electrically coupled to a corresponding electrical contact exposed at the other opposing surface;

the resistive load and the first electrical contact assembly mating with each other with the plurality of electrical contacts exposed at one surface of the planar body and the plurality of electrical contact exposed at one surface of the first electrical contact assembly contacting each other, the resistive load and the electrical contact assembly positioned in the larger aperture of the housing;

a resilient member positioned between the electrical load and the device under test such that a force directed on the electrical load through the aperture of the housing compresses the resilient member to allow contact between the plurality of electrical contacts exposed on the other surface of the first electrical contact assembly and the plurality of the electrical contacts on the device under test and a release of the force directed on the electrical load decompresses the resilient member and disconnects the plurality of contacts of the first electrical contact assembly from the plurality of electrical contacts of the device under test.

2. The connector for selectively coupling an electrical load to a device under test as recited in claim 1 further comprising:

a second electrical contact assembly having opposing surfaces with a plurality of electrical contacts exposed at the respective opposing surfaces with each electrical contact exposed at one opposing surface electrically coupled to a corresponding electrical contact exposed at the other opposing surface; and the second electrical contact assembly mating with the planar body with the plurality of electrical contacts exposed at one surface of the second electrical contact assembly mating with respective electrical contacts exposed at the other surface of the planar body.

3. The connector for selectively coupling an electrical load to a device under test as recited in claim 1 further comprising means for aligning the electrical load in the housing for engaging with the plurality of electrical contacts on the device under test.

4. The connector for selectively coupling an electrical load to a device under test as recited in claim 3 wherein the aligning means comprises first and second tabs with the first tab formed in one sidewall of the larger portion of the aperture of the housing and the second tab formed in an opposing sidewall of the larger aperture of the housing and first and second recesses formed on opposing ends of the electrical load and engaging the respective first and second tabs of the opposing sidewalls of the larger aperture of the housing.

5. The connector for selectively coupling an electrical load to a device under test as recited in claim 3 wherein the aligning means comprises first and second recesses with the first recess formed in one sidewall of the larger portion of the aperture of the housing and the second recess formed in an opposing sidewall of the larger aperture of the housing and first and second tabs formed on opposing ends of the electrical load and engaging the respective first and second recess of the opposing sidewalls of the larger aperture of the housing.

6. The connector for selectively coupling an electrical load to a device under test as recited in claim 3 wherein the aligning means comprises wires extending into the larger portion of the aperture of the housing and engaging apertures formed in the electrical load.

7. The connector for selectively coupling an electrical load to a device under test as recited in claim 1 further comprising means for securing and aligning the housing to the device under test.

8. The connector for selectively coupling an electrical load to a device under test as recited in claim 7 wherein the securing and aligning means further comprise a bolster disposed on an opposing surface of the device under test and aligned with the electrical contacts of the device under test with threaded screws passing through apertures in the bolster and the device under test and engaging the housing.

9. The connector for selectively coupling an electrical load to a device under test as recited in claim 7 wherein the securing and aligning means further comprise wires extending from under the housing and passing through the device under test and secured to an opposing surface of the device under test.

10. The connector for selectively coupling an electrical load to a device under test as recited in claim 1 wherein the plurality of resistors of the resistive load comprise discrete resistors.

11. The connector for selectively coupling an electrical load to a device under test as recited in claim 1 wherein the planar body of the resistive load comprises a sheet formed of an electrically insulating material having a plurality of apertures formed therein with each of the apertures receiving one of the plurality of resistors.

12. The connector for selectively coupling an electrical load to a device under test as recited in claim 2 wherein at least one of the first and second electrical contact assemblies comprises a flex circuit.

13. The connector for selectively coupling an electrical load to a device under test as recited in claim 2 wherein at least one of the first and second electrical contact assemblies comprises an enclosure having compressible spring contacts disposed therein.

14. The connector for selectively coupling an electrical load to a device under test as recited in claim 2 wherein at least one of the first and second electrical contact assemblies comprises an elastomeric material having electrically conductive contact there through.

15. The connector for selectively coupling an electrical load to a device under test as recited in claim 1 wherein the planar body of the resistive load comprises a ceramic substrate having the plurality of resistors formed thereon with each resistor having electrical contacts formed on opposing surfaces of the ceramic substrate.

16. The connector for selectively coupling an electrical load to a device under test as recited in claim 1 wherein the resilient member comprises compression springs.

17. The connector for selectively coupling an electrical load to a device under test as recited in claim 1 wherein the resilient member comprises an elastomeric member.

18. The connector for selectively coupling an electrical load to a device under test as recited in claim 17 wherein the elastomeric member further comprises a plurality of elastomeric spacers.

19. The connector for selectively coupling an electrical load to a device under test as recited in claim 17 wherein the elastomeric member further comprises a serpentine shaped elastomeric spacer having raised and recessed elements disposed in a slot formed at the periphery of the electrical load with the raised portion extending from the electrical load.

20. The connector for selectively coupling an electrical load to a device under test as recited in claim 12 wherein the resilient member comprises bumps formed in the flexible substrate of the first electrical conductive element extending from the resistive load.

* * * * *